(12) United States Patent
Finney et al.

(10) Patent No.: US 9,344,078 B1
(45) Date of Patent: May 17, 2016

(54) INVERSE CURRENT PROTECTION CIRCUIT SENSED WITH VERTICAL SOURCE FOLLOWER

(71) Applicant: Infineon Technologies AG, Neubiberg (DE)

(72) Inventors: Adrian Finney, Villach (AT); Bogdan-Eugen Matei, Braila (RO)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 14/602,791

(22) Filed: Jan. 22, 2015

(51) Int. Cl.
| | | |
|---|---|---|
| *H01L 21/332* | (2006.01) | |
| *H03K 17/082* | (2006.01) | |
| *H01L 27/02* | (2006.01) | |
| *H01L 29/78* | (2006.01) | |
| *H01L 27/06* | (2006.01) | |

(52) U.S. Cl.
CPC ........ *H03K 17/0822* (2013.01); *H01L 27/0251* (2013.01); *H01L 27/0629* (2013.01); *H01L 29/7802* (2013.01)

(58) Field of Classification Search
CPC .......... H03K 17/0822; H03K 27/0251; H03K 27/0629; H03K 29/7802
USPC .......... 257/133–135, 355, 328; 438/137–138, 438/173; 330/253; 326/33; 327/109; 361/84
See application file for complete search history.

(56) References Cited

U.S. PATENT DOCUMENTS

| | | | | | |
|---|---|---|---|---|---|
| 4,862,233 | A * | 8/1989 | Matsushita | ......... | H01L 27/0922 257/328 |
| 4,929,884 | A * | 5/1990 | Bird | .......................... | G05F 3/24 257/E27.064 |
| 5,298,869 | A * | 3/1994 | Jinich | ..................... | H03F 1/301 323/280 |
| 5,424,892 | A * | 6/1995 | Topp | ................ | H03K 17/04123 323/908 |
| 5,670,813 | A * | 9/1997 | Harada | ............... | H01L 27/0251 257/215 |
| 6,191,454 | B1 * | 2/2001 | Hirata | ................. | H01L 27/0251 257/355 |
| 6,399,990 | B1 * | 6/2002 | Brennan | ............. | H01L 27/0266 257/355 |
| 7,342,760 | B2 * | 3/2008 | Mullauer | ............ | H01L 27/0251 361/18 |
| 7,504,888 | B1 * | 3/2009 | Ju | ............................. | H03F 1/14 330/278 |

(Continued)

*Primary Examiner* — Mohammed Shamsuzzaman
(74) *Attorney, Agent, or Firm* — Shumaker & Sieffert, P.A.

(57) ABSTRACT

A monolithic integrated circuit includes a low-voltage control circuit, a vertical power transistor, and a source follower. The vertical power transistor includes at least a drain. The source follower includes a drain that is coupled to the drain of the vertical power transistor, a gate that is coupled to a limit voltage node, and a source that is coupled to a high impedance node. The source follower is arranged such that a source voltage at the source of the source follower is a voltage-limited version of the drain voltage of the vertical power transistor. The low-voltage control circuit includes a driver and protection circuit that is arranged to detect the source voltage, to drive the vertical power transistor, and to adjust how the vertical power transistor is biased based, at least in part, on the source voltage.

15 Claims, 8 Drawing Sheets

(56) References Citedks

U.S. PATENT DOCUMENTS

| | | | | | |
|---|---|---|---|---|---|
| 7,755,419 | B2* | 7/2010 | Rao | ............... | G05F 3/262 |
| | | | | | 323/315 |
| 7,869,176 | B2* | 1/2011 | Davison | ............ | G05F 1/571 |
| | | | | | 361/111 |
| 8,115,280 | B2* | 2/2012 | Chen | ............ | H01L 21/8224 |
| | | | | | 257/197 |
| 9,111,765 | B2* | 8/2015 | Huang | ............ | H01L 27/0623 |
| 2006/0001099 | A1* | 1/2006 | Motz | ............ | H01L 29/7801 |
| | | | | | 257/355 |
| 2006/0038584 | A1* | 2/2006 | Mitsuda | ............ | H03K 17/0822 |
| | | | | | 326/33 |
| 2007/0171590 | A1* | 7/2007 | Nagata | ............ | H02H 3/087 |
| | | | | | 361/93.1 |
| 2008/0290911 | A1* | 11/2008 | Williams | ............ | H03K 17/6872 |
| | | | | | 327/109 |
| 2009/0039869 | A1* | 2/2009 | Williams | ............ | G01R 19/0092 |
| | | | | | 324/123 R |
| 2009/0168508 | A1* | 7/2009 | Kapoor | ............ | G11C 11/41 |
| | | | | | 365/177 |
| 2009/0251214 | A1* | 10/2009 | Shkidt | ............ | H03F 3/45179 |
| | | | | | 330/253 |
| 2012/0182049 | A1* | 7/2012 | Garbossa | ............ | H02M 3/155 |
| | | | | | 327/109 |
| 2012/0249210 | A1* | 10/2012 | Shimizu | ............ | G01S 7/52017 |
| | | | | | 327/333 |
| 2012/0249303 | A1* | 10/2012 | Hadley | ............ | G06K 7/0008 |
| | | | | | 340/10.1 |

* cited by examiner

FIG. 8

INVERSE CURRENT PROTECTION CIRCUIT SENSED WITH VERTICAL SOURCE FOLLOWER

TECHNICAL FIELD

This disclosure relates to electronic circuits, and more specifically, to the use of a vertical power transistor in an integrated circuit that also includes low-voltage logic.

BACKGROUND

Smart semiconductor switches are increasingly used to replace electro-mechanical relays in automotive applications and a broad variety of other applications, such as driving motors in automatic doors. In some instances, a smart power semiconductor may be implemented with vertical power transistor, such as a vertical power DMOS. The vertical power DMOS may be integrated with a control circuit into separate wells within the same silicon.

SUMMARY

In some examples, a monolithic integrated circuit includes a low-voltage control circuit, a vertical power transistor, and a source follower. The vertical power transistor includes a drain. The source follower includes a drain that is coupled to the drain of the vertical power transistor, a gate that is coupled to a limit voltage node, and a source that is coupled to a high impedance node. The source follower is arranged such that a source voltage at the source of the source follower is a voltage-limited version of the drain voltage of the vertical power transistor. The low-voltage control circuit includes a driver and protection circuit that is arranged to detect the source voltage, to drive the vertical power transistor, and to adjust how the vertical power transistor is biased based, at least in part, on the source voltage.

In some examples, a device comprises a monolithic integrated circuit, where the monolithic integrated circuit includes a low-voltage control circuit, a vertical power transistor, and a source follower. The vertical power transistor includes a drain. The source follower includes a drain that is coupled to the drain of the vertical power transistor, a gate that is coupled to a limit voltage node, and a source that is coupled to a high impedance node. The source follower is arranged such that a source voltage at the source of the source follower is a voltage-limited version of the drain voltage of the vertical power transistor. The low-voltage control circuit includes a driver and protection circuit that is arranged to detect the source voltage, to drive the vertical power transistor, and to adjust how the vertical power transistor is biased based, at least in part, on the source voltage.

In some examples, a method comprises using a high impedance device and a source follower including a drain that is coupled to a drain of a vertical power transistor and a source to output a source voltage at the source of the source follower such that the source voltage is a voltage-limited version of a voltage at the drain of a vertical power transistor; detecting the source voltage; driving the vertical power transistor; and adjusting how the vertical power transistor is biased based, at least in part, on the source voltage.

In some examples, a device comprises means for using a high impedance device and a source follower including a drain that is coupled to a drain of a vertical power transistor and a source to output a source voltage at the source of the source follower such that the source voltage is a voltage-limited version of a voltage at the drain of a vertical power transistor; means for detecting the source voltage; means for driving the vertical power transistor; and means for adjusting how the vertical power transistor is biased based, at least in part, on the source voltage.

The details of one or more examples of the disclosure are set forth in the accompanying drawings and the description below. Other features, objects, and advantages of the disclosure will be apparent from the description and drawings, and from the claims.

BRIEF DESCRIPTION OF DRAWINGS

Non-limiting and non-exhaustive examples of the present disclosure are described with reference to the following drawings.

DETAILED DESCRIPTION

Various examples of this disclosure will be described in detail with reference to the drawings, where like reference numerals represent like parts and assemblies throughout the several views. Reference to various examples does not limit the scope of this disclosure which is limited only by the scope of the claims attached hereto. Additionally, any examples set forth in this specification are not intended to be limiting and merely set forth some of the many possible examples of this disclosure.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," or "in one example," as used herein does not necessarily refer to the same embodiment or example, although it may be the case. Similarly, the phrase "in some embodiments," or "in some examples," as used herein, when used multiple times, does not necessarily refer to the same embodiments or examples, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. Where suitable, the term "gate" is intended to be a generic term covering both "gate" and "base"; the term "source" is intended to be a generic term covering both "source" and "emitter"; and the term "drain" is intended to be a generic term covering both "drain" and "collector." The term "coupled" means at least either a direct electrical connection between the items connected, or an indirect connection through one or more passive or active intermediary devices. The term "signal" means at least one current, voltage, charge, temperature, data, or other signal.

Briefly stated, a monolithic integrated circuit includes a low-voltage control circuit, a vertical power transistor, and a source follower. The vertical power transistor includes at least a drain. The source follower includes a drain that is coupled to the drain of the vertical power transistor, a gate that is coupled to a limit voltage node, and a source that is coupled to a high impedance node. The source follower is arranged such that a source voltage at the source of the source follower is a voltage-limited version of the drain voltage of the vertical power transistor. The low-voltage control circuit includes a driver and protection circuit that is arranged to detect the source voltage, to drive the vertical power transistor, and to adjust how the vertical power transistor is biased based, at least in part, on the source voltage.

Figure 1:
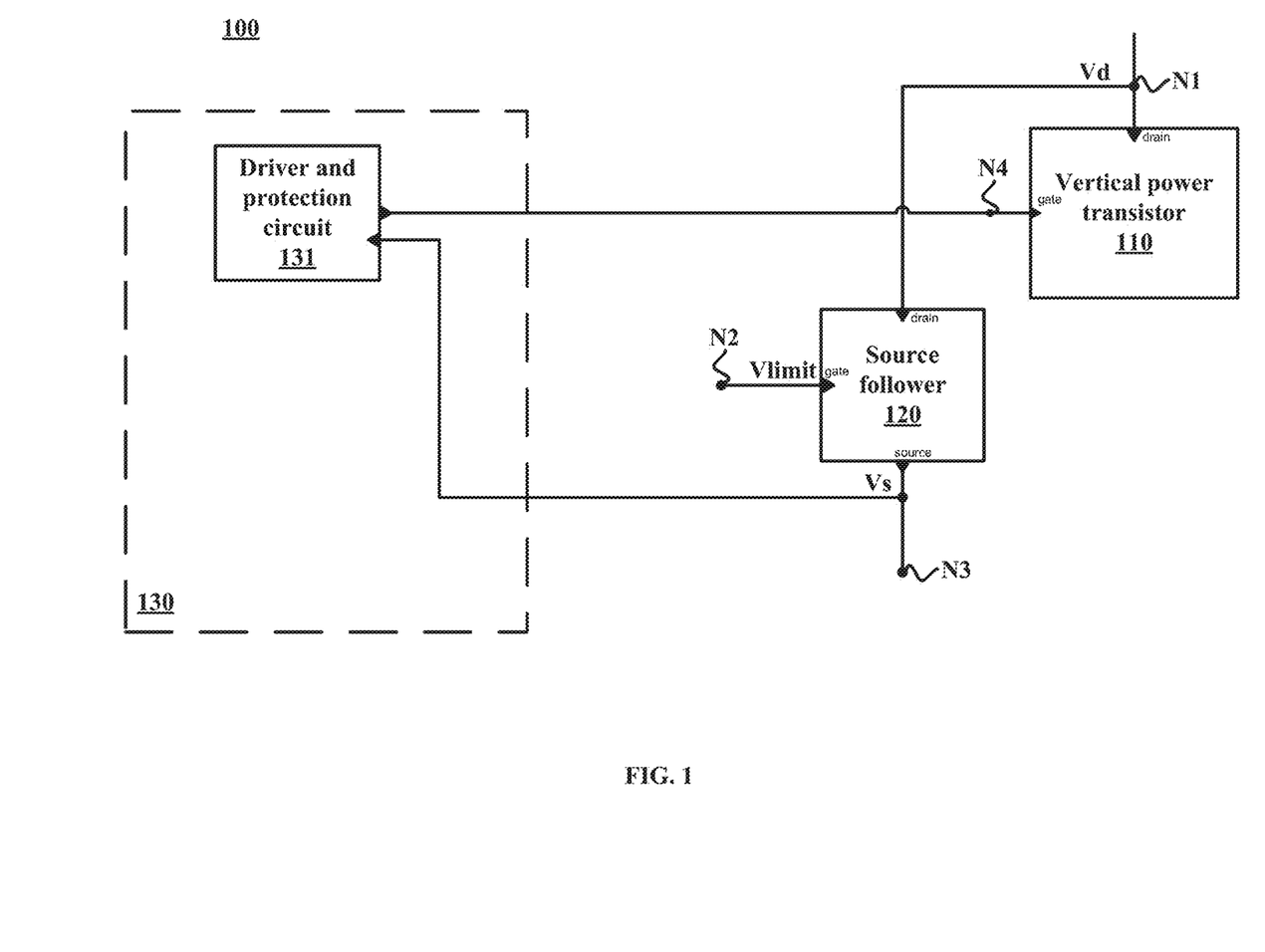
FIG. 1 is a block diagram illustrating an example of a monolithic integrated circuit.

FIG. 1 is a block diagram illustrating an example of monolithic integrated circuit 100 in accordance with aspects of the disclosure. Monolithic integrated circuit 100 includes low-voltage control circuit 130, vertical power transistor 110, and source follower 120. Vertical power transistor 110 includes at least a drain that is coupled to node N1 and a gate that is coupled to node N4. Source follower 120 includes at least a drain that is coupled to node N1, a gate that is coupled to limit voltage node N2, and a source that is coupled to high impedance node N3. Source follower 120 is arranged such that a source voltage Vs at the source of source follower 120 is a voltage-limited version of the drain voltage Vd of vertical power transistor 110. Low-voltage control circuit 130 includes driver and protection circuit 131, which is arranged to detect source voltage Vs, to drive vertical power transistor 110, and to adjust how vertical power transistor 110 is biased based, at least in part, on source voltage Vs. Driver and protection circuit 131 includes at least an input that is coupled to high impedance node N3, and an output that is coupled to node N4. In some examples, driver and protection circuit 131 is configured to detect sense voltage Vs at node high impedance N3 and drive vertical power transistor 110 at node N4. Low-voltage control circuit 130 is configured to operate at a voltage level that is lower than the maximum voltage for drain voltage Vd.

Figure 2:
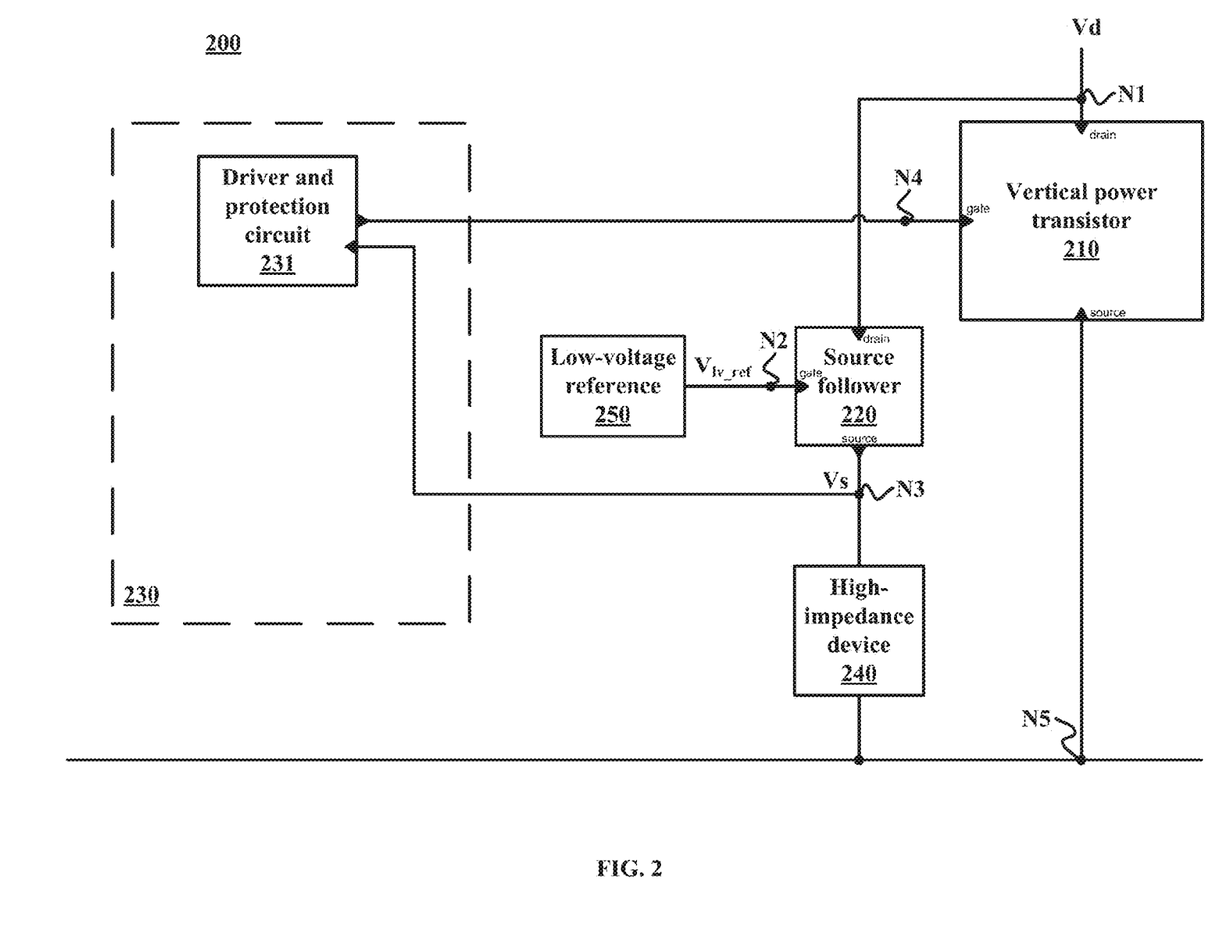
FIG. 2 is a block diagram illustrating an example of the monolithic integrated circuit of FIG. 1 that further includes a low-voltage reference and a high-impedance device.

Connections that are not shown in FIG. 1 are not necessarily intended to indicate floating nodes, but instead show connections that may be connected in different ways in different examples, or which may be connected to external components in some examples. The drain of vertical power transistor 110 is coupled to node N1, which may receive an external or internal voltage Vd in some examples. The source of source follower 120 is coupled to high impedance node N3, where node N3 is coupled to a high-impedance device in some examples, as illustrated in FIG. 2 in accordance with some examples. The high-impedance device that may be coupled to high impedance node N3 may be either external to the monolithic integrated circuit (e.g., 100) or internal to the monolithic integrated circuit in various examples.

FIG. 2 is a block diagram illustrating an example of monolithic integrated circuit 200, which may be employed as an example of monolithic integrated circuit 100 of FIG. 1. Monolithic integrated circuit 200 may further include high impedance device 240 and low-voltage reference circuit 250.

Vertical power transistor 210 also includes a source that is coupled to node N5 in some examples. High impedance device 240 is coupled between node N3 and N5 in some examples. Low-voltage reference 250 is arranged to provide low-voltage reference signal lv_ref at node N2 in some examples.

Although FIG. 2 illustrates an example that includes low-voltage reference 250 as a separate device, in other examples, low-voltage reference signal lv_ref is received from an already existing portion the circuit, so that no separate low-voltage reference signal or separate low-voltage reference circuit is needed. In some examples, node N2 is coupled to the supply voltage for low-voltage control circuit 230, so that the supply voltage for low-voltage control circuit 230 is lv_ref, and no separate low-voltage reference 250 is needed.

In some examples, source follower 220 and high-impedance device 240 operate together as a voltage divider in which the on-resistance of source follower 220 is small relative to the impedance of high-impedance device 240 when drain voltage Vd is less than $V_{lv\_ref}$–Vth, where Vth is the threshold voltage of source follower 220. Accordingly, in these examples, when drain voltage Vd is less than $V_{lv\_ref}$–Vth, source voltage Vs is substantially equal to drain voltage Vd. However, in these examples, when Vd is greater than $V_{lv\_ref}$–Vth, Vs is equal to $V_{lv\_ref}$–Vth. Accordingly, Vs is a voltage-limited version of Vd.

Driver and protection circuit 231 may be arranged to detect source voltage Vs, and to determine whether vertical power transistor 210 is reversed biased or not based on the detected source voltage Vs. If driver and protection circuit 231 detects that vertical power transistor 210 is reverse biased, then driver and protection circuit 231 may adjust how transistor M1 is being biased by doing one or both of the following: (1) switching the well containing the low-voltage control circuit 230 to voltage Vd; (2) directly turning on and driving vertical power transistor 210 to reduce the reverse bias of vertical power transistor 210.

Because Vs is limited to being no greater than $V_{lv\_ref}$–Vth, it is possible for driver and protection circuit 231 to determine whether vertical power transistor 210 is reverse biased or not without exposing driver and protection circuit 231 or any other portion of low-voltage control circuit 230 to any high voltage. Driver and protection circuit 231 may detect voltage Vs rather than voltage Vd, where Vs is a voltage-limited version of Vd, and where directly sensing Vd could result in sensing a voltage that may be too great for driver and protection circuit 231.

In some examples, low-voltage reference voltage $V_{lv\_ref}$ is equal to or relatively close to the power supply voltage of low-voltage logic circuit 240, such as 5V in some examples. However, the disclosure is not so limited, and other suitable values may be employed for $V_{lv\_ref}$, as long as $V_{lv\_ref}$–Vth is safe for driver and protection circuit 231.

In some examples, node N5 may be connected to Ground, but the disclosure is not so limited. Also, although FIG. 2 illustrates an example in which high-impedance device 240 and the source of vertical power transistor 210 are coupled to the same node, the disclosure is no so limited, and high-impedance device 240 and the source of vertical power transistor 210 may be connected to different nodes in various examples within the scope and spirit of the disclosure.

Figure 3:
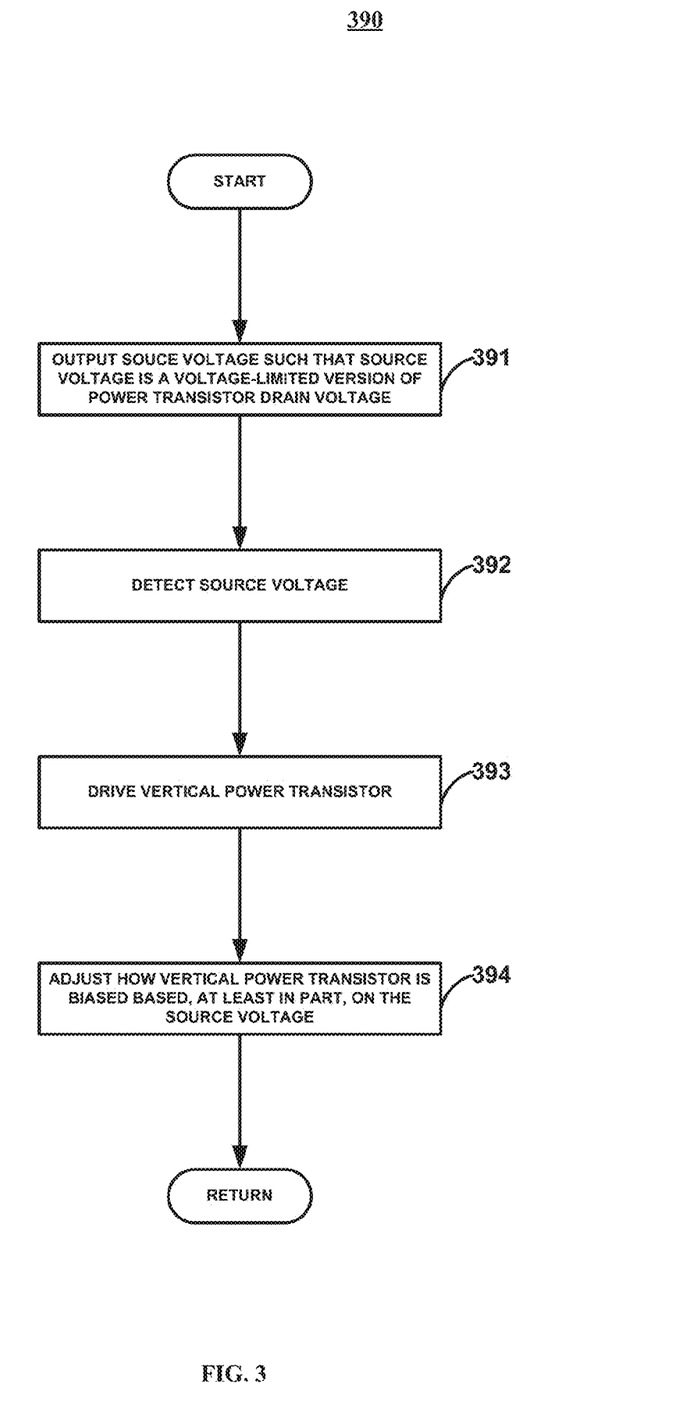
FIG. 3 is a flow diagram illustrating an example of a process.

FIG. 3 is a flow diagram illustrating an example of a process (390). In one example, process 390 proceeds as follows. After a start block, a high impedance device (e.g., 240 of FIG. 2) and a source follower (e.g., 220 of FIG. 2) output a source voltage (e.g., Vs) at the source of the source follower (e.g., 220 of FIG. 2) such that the source voltage (e.g., Vs) is a voltage-limited version of a voltage (e.g., Vd) at a drain of a vertical power transistor (e.g., 210) (391). Next, driver and protection circuit 231 detects the source voltage (e.g., Vs) (392). Then, driver and protection circuit 231 drives the vertical power transistor (e.g., 210) (393). Driver and protection circuit 231 adjusts how the vertical power transistor (e.g., 210) is biased based, at least in part, on the source voltage (e.g., Vs) (394). The process then advances to a return block, where other processing is resumed.

In some examples, after detecting the source voltage (e.g., Vs) at block 392, the vertical power transistor (e.g., 210) can be turned on at block 393. In some examples, after detecting the source voltage (Vs) at block 392, a well-switching transistor can be turned on in order to connect the analog well of the monolithic integrated circuit (e.g. 200) to the lowest potential (i.e., the drain potential at node N1), as discussed in greater detail below for some examples.

Figure 4:
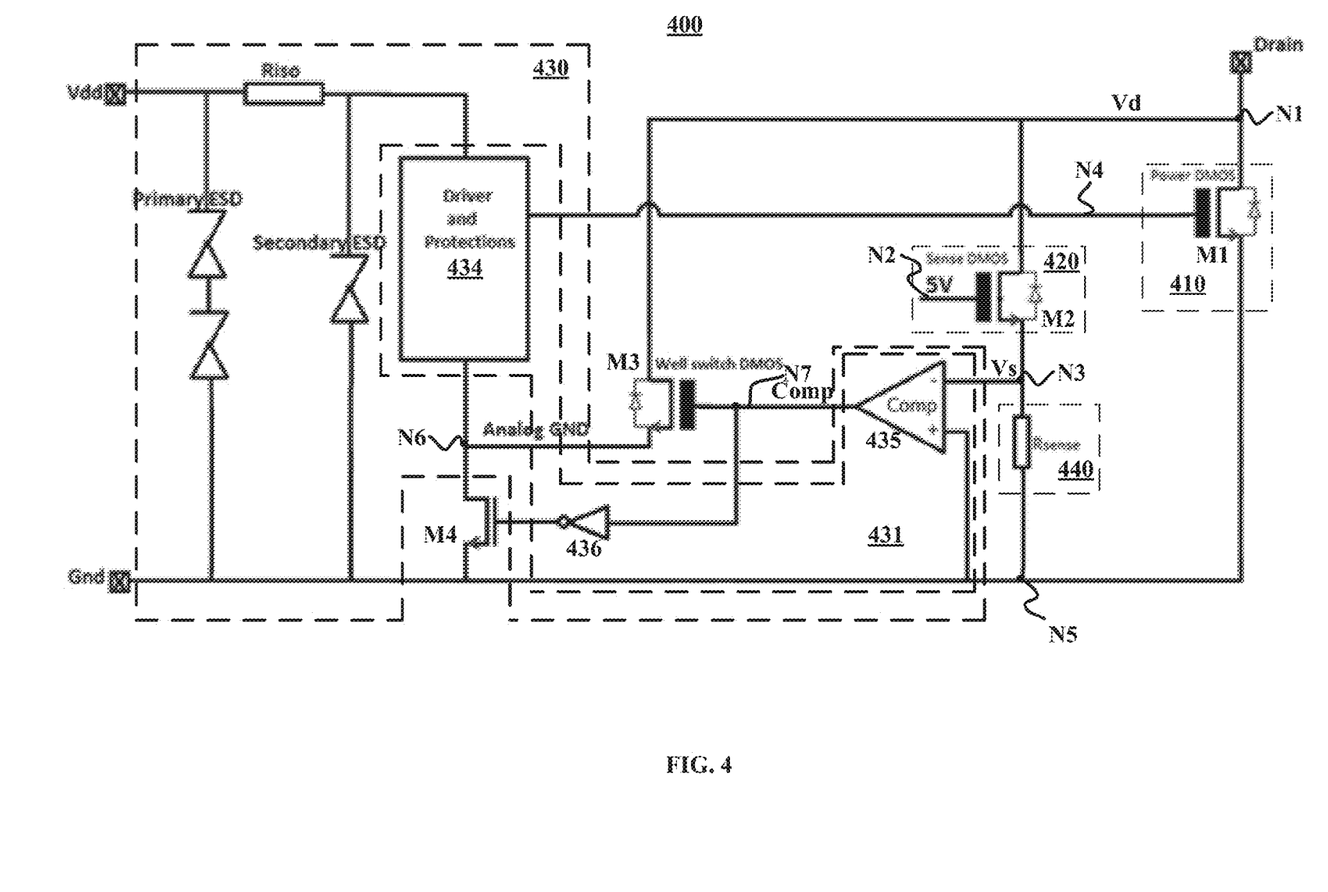
FIG. 4 is a block diagram illustrating an example of the monolithic integrated circuit of FIG. 1 or FIG. 2 that further includes two switching transistors.

FIG. 4 is a block diagram illustrating an example of monolithic integrated circuit 400, which may be employed as an example of monolithic integrated circuit 200 of FIG. 2. In some examples, vertical power transistor 410 includes power DMOS M1, source follower 420 includes sense DMOS M2, and high-impedance device 440 includes resistor Rsense. In some examples, monolithic integrated circuit 400 further includes well switch DMOS M3 and ground switching transistor M4. In some examples, low-voltage control circuit 430 includes a power-supply input that is coupled to VDD. Low-voltage control circuit 430 may further include resistor Riso, primary ESD device PrimaryESD, and secondary ESD device SecondaryESD. Driver and protection circuit 431 may further include driver and protections block 434, comparator 435, and inverter 436.

Figure 5:
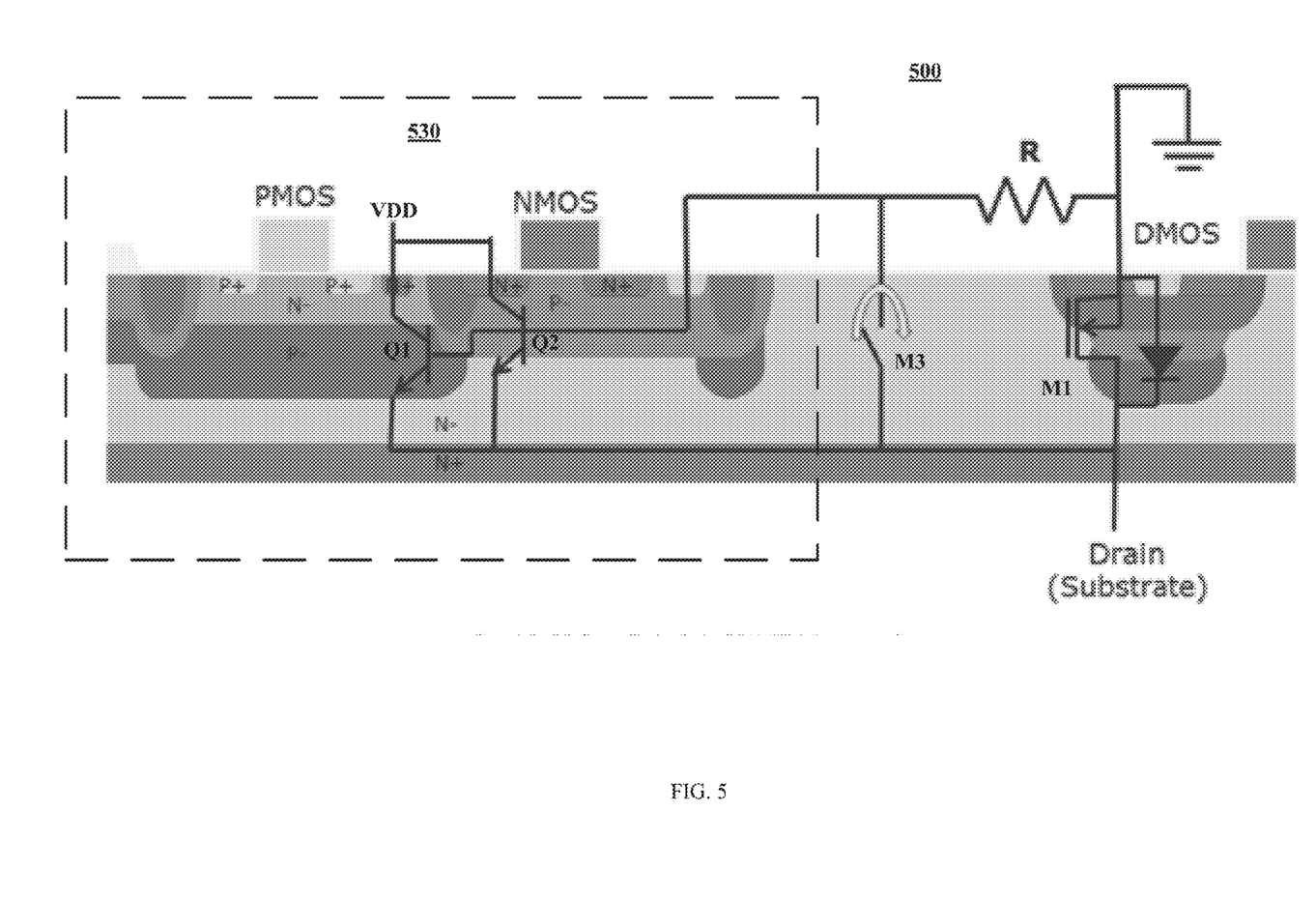
FIG. 5 is a diagram illustrating an example of the monolithic integrated circuit of FIG. 4.

In some examples, as illustrated in FIG. 5 according to one example, low-voltage control circuit 430/530 and vertical DMOS M1 are integrated into separate wells within the same silicon. FIG. 5 is a diagram illustrating an example of monolithic integrated circuit 500, which may be employed as an example of monolithic integrated circuit 400 of FIG. 4. In some examples, low-voltage control circuit 530 includes parasitic transistor Q1 and parasitic transistor Q2.

As illustrated in FIG. 5, low-voltage control circuit 530 and vertical DMOS M1 are integrated into separate wells within the same silicon in some examples. In some examples, well switch DMOS M3 is arranged to switch the well containing the low-voltage control circuit 530 to the Drain (substrate) potential of vertical DMOS M1 whenever vertical DMOS M1 is reverse biased, and/or to activate power DMOS M1 to reduce the reverse bias. Closing switch M3 when M1 is reversed biased or to reduce the reverse bias of M1 may minimize current conduction from the logic well into the substrate, to prevent the current conduction from the logic well into the substrate causing logic in low-voltage control circuit 530 from malfunctioning.

For example, when the logic well is forward biased into the N-epitax, the parasitic bipolar transistors Q1 and Q2 in low-voltage control circuit 530 could conduct considerable current, effectively short circuiting the logic supply VDD. Closing switch M3 when M1 is reverse biased or to reduce the reverse bias of M1 may prevent short circuit of the logic supply VDD.

Generally, a vertical transistor is a transistor, in which the load current (i.e., the drain-source current in the case of a MOSFET) is directed to a top surface (where the source electrode is located) of the semiconductor body in a vertical direction through the semiconductor body from a bottom surface (where the drain electrode is located) of the semiconductor body. Vertical transistors can be, for example, planar or trench type. Vertical bipolar transistors may also be employed. For trench-based vertical transistors, transistor cells are formed with gate trenches extending from the top surface into the epitaxial layer of the semiconductor body. The semiconductor portions between two neighboring trenches form the transistor source and body regions formed, e.g., by ion implantation, or diffusion of dopants.

Returning to FIG. 4, in some examples, driver and protection circuit 431 is arranged to sense a reverse bias condition in transistor M1, and to do so without a high-voltage logic device, so that the logic well can be switched and/or power DMOS M1 turned on, via control of switching transistors M3 and M4. When transistor M1 is reverse biased, the body diode of transistor M1 is conducting.

In some examples, as shown in FIG. 4, transistor M2 receives a fixed voltage of 5V at the gate of transistor M2. In some examples, the fixed voltage of 5V is VDD, and node N2 is the same node as VDD. In other examples, node N2 and VDD are separate nodes. Resistor Rsense may have a very high resistance, such as hundreds of kilo-ohms or mega-ohms. In some examples, the high resistance of resistor Rsense minimizes the current flow from drain of transistor M2 to the source of transistor M2 when voltage Vd is at a high potential.

In some examples, resistor Rsense and transistor M2 operate as follows. When Vd<5V-Vth (where Vth is the threshold voltage of transistor M2), the source potential Vs of sense DMOS M2 is very nearly equal to Vd. Vs is nearly equal to Vd when Vd<(5V-Vth) because the on-resistance of transistor M2 ($Ron_{M2}$) and resistance Rsense act together as a voltage divider, and because Rsense>>$Ron_{M2}$, Vs is nearly equal to Vd. However, when Vd>(5V-Vth), Vs is restricted to (5V-Vth), because transistor M2 turns off when Vd>(5V-Vth). Accordingly, voltage Vs is a voltage-limited version of voltage Vd. Accordingly, the source connection of sense DMOS M2 transmits the Power DMOS M1 Drain potential Vd to low-voltage control circuit 430 when Vd is at low or negative voltages, but does not transmit dangerously high voltages. Sense DMOS M2 supports the high drain voltage Vd.

In some examples, transistor M2 is a separate vertical DMOS in a source follower configuration, such that transistor M2 is arranged to safely connect the Drain of Power DMOS M1 (which may be at a high voltage) to low-voltage logic. In some examples, the application of a small gate voltage Vg (e.g., 5V as shown in FIG. 4 in accordance with one example) to the gate vertical Sense DMOS M2 at node N2 prevents the transmission of voltages higher than (Vg-Vth), but still allows transmission of reverse or small forward voltages to low-voltage control circuit 430.

In some examples, comparator 435 is arranged to compare voltage Vs with a relatively small voltage, such as ground, and to output comparison output signal Comp based on the result of the comparison. In some examples, Switches M3 and M4 are opened or closed based on the result of the comparison performed by comparator 435, which may be indicated via the logic level of comparison output signal Comp. In the examples illustrated in FIG. 4, comparison output signal Comp directly controls the opening and closing of transistor M3, while inverter 436 provides an inverted version of comparison output signal Comp to control the opening and closing of transistor M4.

In some examples, based on comparison output signal Comp, either switch M3 is open and switch M4 is closed, or switch M4 is open and switch M3 is closed. In some examples, when switch M4 is closed, the analog GND input of driver and protection block 434 is connected to Gnd. In some examples, GND is the substrate potential. In some examples, when switch M3 is closed, the analog GND input of driver and protection block 434 is connected to node N1. In some examples, a break-before-make scheme may be employed to ensure that switches M3 and M4 are not both on simultaneously.

In some examples, driver and protection circuit 431 is arranged to operate as follows. Driver and protection circuit 431 is arranged to sense voltage Vs via comparator 435. The output of comparator 435, comparison output signal Comp, is high or low depending on whether or not power DMOS M1 is detected to be reversed biased or not, which is sensed by sensing source voltage Vs, where voltage Vs is a voltage-limited version of voltage Vd. If voltage Vs exceeds a threshold, then comparison output signal Comp is at an asserted logic level, indicating that a reverse bias condition is detected for transistor M1, so that switch M3 is closed (and switch M4 is open). As discussed above, closing switch M3 when vertical power transistor M1 is reversed biased or to reduce the reverse bias of vertical power transistor M1 may minimize current conduction from the logic well into the substrate, to prevent the current conduction from the logic well into the substrate causing logic in low-voltage control circuit 430 from malfunctioning. Conversely, if voltage Vs does not exceed the threshold, then comparison output signal Comp is at an unasserted logic level, indicating that no reverse bias condition is detected for transistor M2, so that switch M4 is closed (and switch M3 is open).

In some examples, correct functioning of Sense DMOS circuit M2 is based on the on-resistance of transistor M2 being significantly lower than Rsense, rather than the exact ratio of these resistances. In some examples, resistor Rsense has a high value of Rsense to minimize current flow through Sense DMOS M2 when Vd is at a high voltage. Resistor Rsense may be an active resistor or a passive resistor in various examples. While resistor Rsense is one example of high-impedance device 440, in various examples, Rsense may be replaced with any suitable device having a relatively high impedance. As one example, Rsense may be replaced with a reverse-biased polysilicon diode. Using a polysilicon diode leakage current in this way offers considerable space saving while still fulfilling the condition that $Ron_{M2} \ll Rsense$.

Low-voltage control circuit 430 may include a variety of protection functions. For instance, in some examples of low-voltage control circuit 430, Resistor Riso, primary ESD device 432, and secondary ESD device 433 operate together to provide ESD protection for low-voltage control circuit 430.

Driver and protections block 434 may be arranged to drive DMOS M1, and to provide protection for DMOS M1. In some examples, driver and protections block 434 turns transistor M1 off under one or more protection conditions, such as when transistor M1 goes into an over-temperature condition, an over-current condition, an over-voltage condition, and/or the like. In some examples, driver and protections block 434 includes logic for determining when vertical power DMOS transistor M1 should be driven, and further includes circuitry for driving vertical power DMOS transistor M1 when the logic indicates that vertical power DMOS transistor M1 should be driven.

In some examples, the circuitry of FIG. 4 provides protection for the condition of vertical power DMOS transistor M1 being in a reverse biased state, that is, protection for the condition of the body diode of vertical power DMOS transistor M1 conducting.

Transistor M1 may be employed in various suitable applications. In some examples, transistor M1 may be employed as a "smart" semiconductor switch, for example as a replacement for an electro-mechanical relay. As a replacement for an electro-mechanical relay, transistor M1 may be employed in applications such as automotive applications and a broad variety of other applications, such as driving motors in automatic doors, such as supermarket doors that close automatically.

Figure 6:
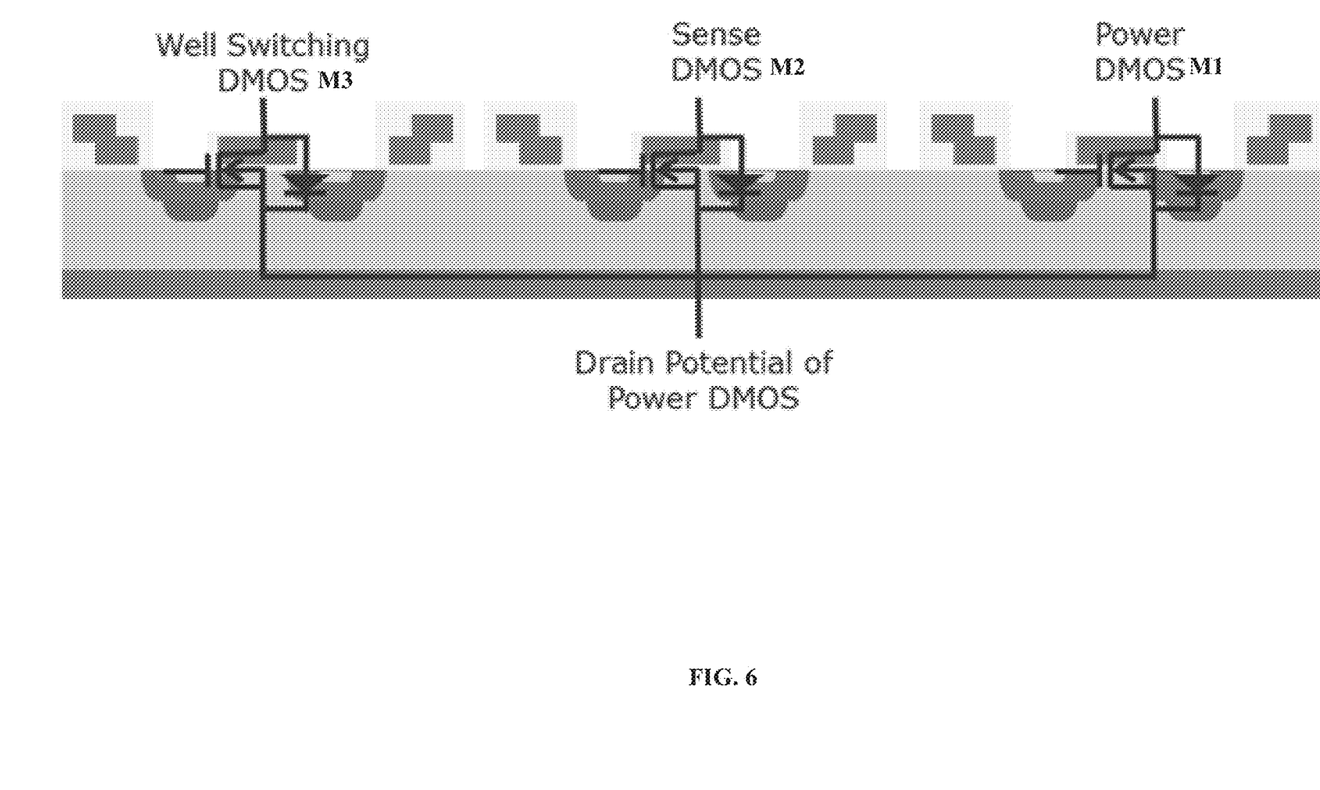
FIG. 6 is a diagram illustrating an example of the monolithic integrated circuit of FIG. 4 in which transistors M1, M2, and M3 share a common drain.

In some examples, sense DMOS M2 and (if present) well switching DMOS M3 need to support at least the same voltage as Power DMOS M1. Because all 3 DMOS M1, M2, and M3 have a common drain connection in these examples, this can be achieved by integrating all DMOS transistors M1, M2, and M3 as separate vertical DMOS transistors within the same silicon, as shown in FIG. 6 in accordance with one example. In this context, "separate" means that some voltage can be supported between the various source connections although not necessarily the entire Power DMOS breakdown voltage. In some examples, as illustrated in FIG. 6, a planar structure may be employed. In other examples, a trench structure may be employed. Further, although various examples of vertical power DMOS transistors have been described for transistor M1, in various examples, transistor M1 may be any suitable type of vertical power transistor, such as a bipolar transistor, IGBT, and/or the like.

The well switching discussed above can be used not just for vertical parasitic suppression, but also later parasitic suppression. For instance, for a lateral NPN in a P-substrate technology where two N-epitaxial regions are junction-isolated, lateral parasitic suppression may be achieved by the well switching.

Figure 7:
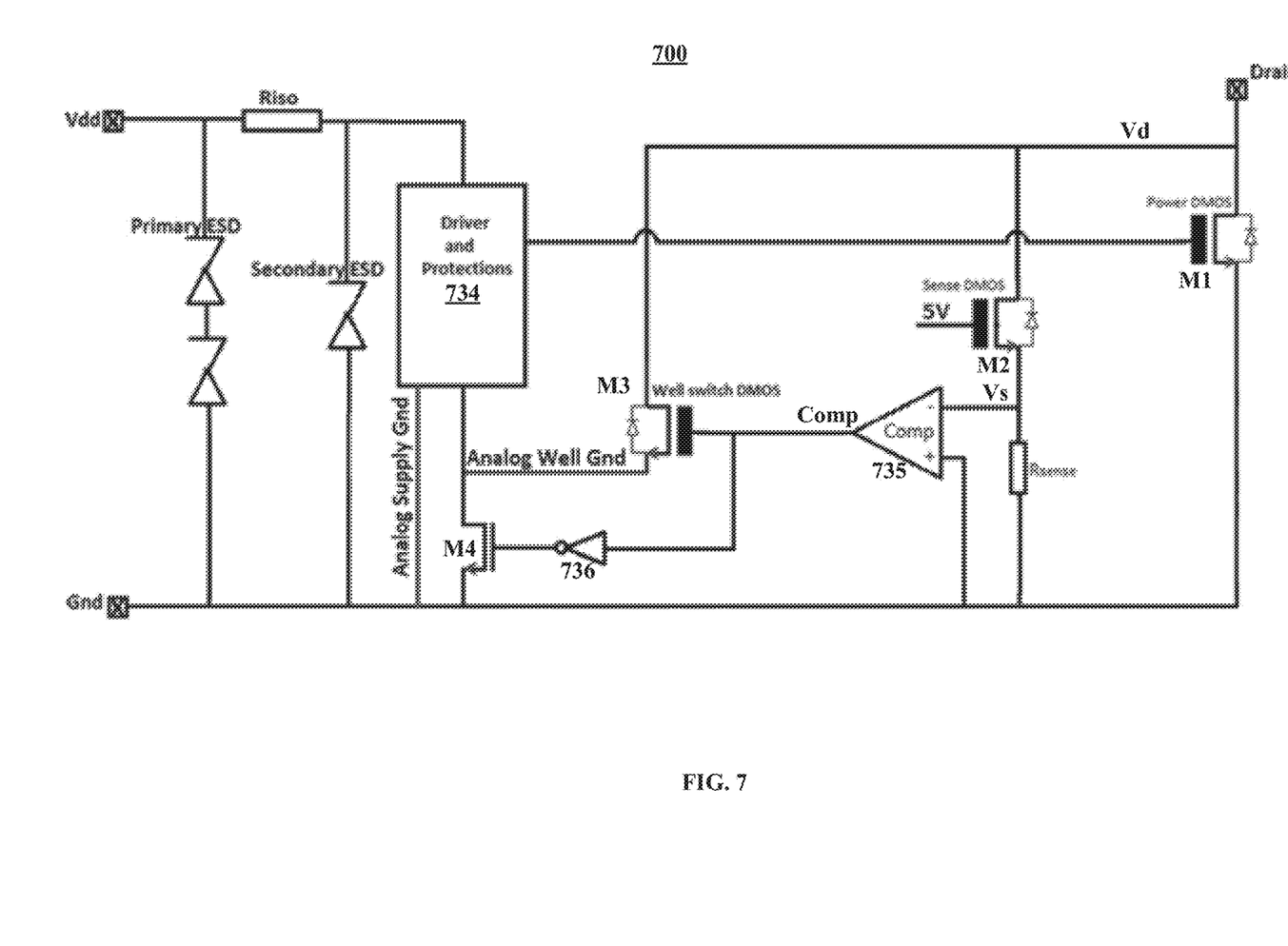
FIG. 7 is a block diagram illustrating an example of the monolithic integrated circuit of FIG. 4 with an alternative ground arrangement.

FIG. 7 is a block diagram illustrating an example of monolithic integrated circuit 700, which may be employed as an example of monolithic integrated circuit 400 of FIG. 4 with an alternative ground arrangement. In the example illustrated in FIG. 7, the Analog Well Ground is connected to the well, which is switched to the drain potential of power DMOS M1 during reverse bias of the Power DMOS M1 because the drain of M1 is always at the lowest potential. On the other hand, in the example illustrated in FIG. 7, the Analog Supply Ground is always connected to the global ground line, ensuring a stable ground potential for biasing Driver and Protections block 734.

Driver and Protections block 734 may include, inter alia, circuitry for driving power DMOS M1, logic for determining when to drive power DMOS M1, protections to determine conditions under which power DMOS M1 should not be driven, and logic for appropriately driving power transistor DMOS under these conditions, such as over-voltage conditions, over-temperature conditions, over-current conditions, and/or the like. For example, DMOS M1 can be protected either by turning it on (e.g., during an over-voltage condition), or by suitably controlling DMOS M1 (e.g., by limiting DMOS M1 to a maximum safe current).

Figure 8:
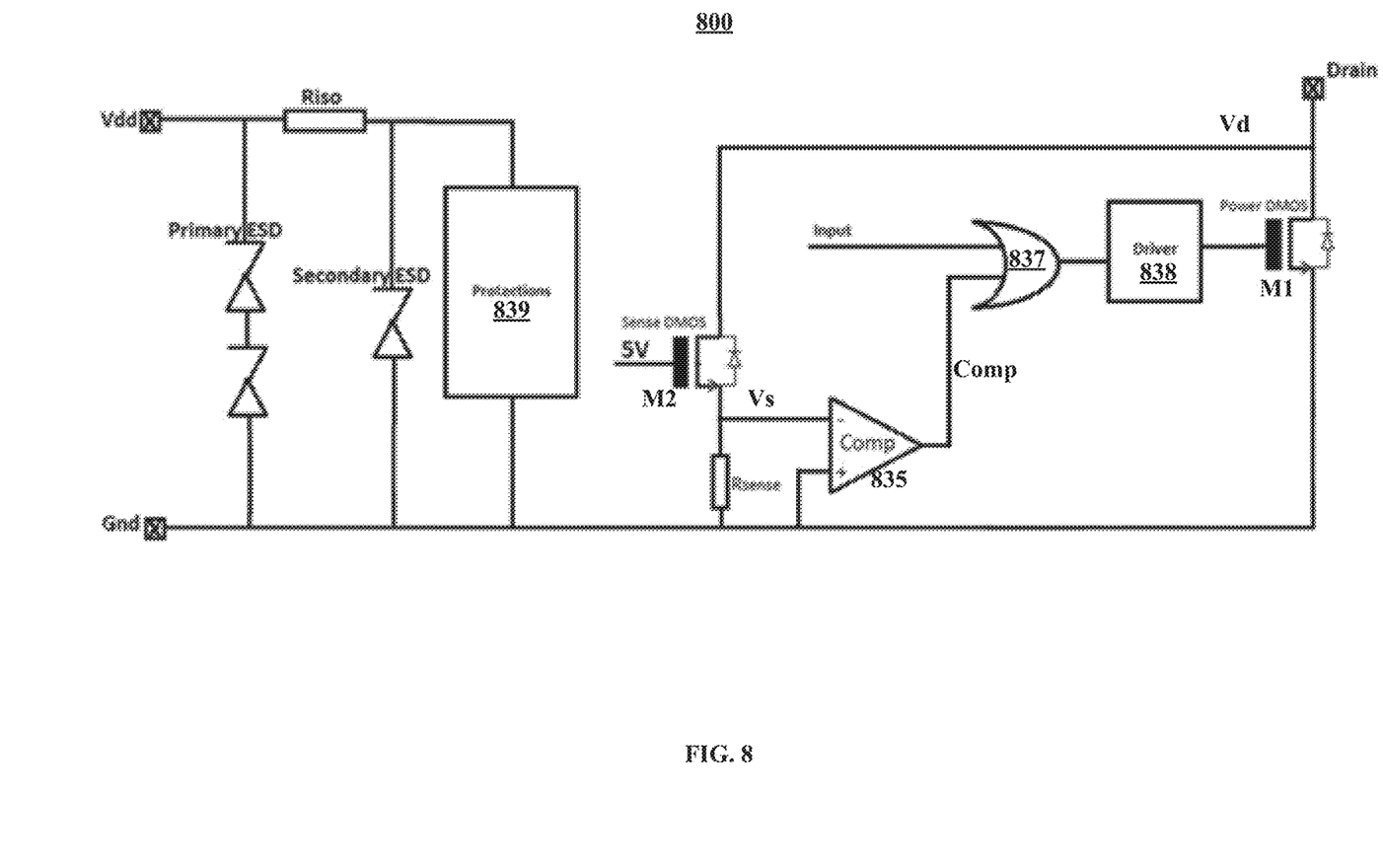
FIG. 8 is a block diagram illustrating an example of the monolithic integrated circuit of FIG. 4 in which the vertical power DMOS is driven directly, in accordance with aspects of the present disclosure.

FIG. 8 is a block diagram illustrating an example of monolithic integrated circuit 800, which may be employed as an example of monolithic integrated circuit 400 of FIG. 4 in which vertical power DMOS transistor M1 is driven directly. Driver and protection circuit 831 may include protections block 839, comparator 835, OR gate 837, and driver 838.

In some examples of circuit 800, instead of switching the well with a dedicated separate well-switching DMOS, the reverse bias is limited by turning on Power DMOS M1. Turning on power DMOS M1 instead of switching the well with a well switching DMOS has the advantage of avoiding the need for a Well Switching DMOS, but has the disadvantage that a much higher capacitance may need to be switched, thereby restricting the slew rate. Care is also needed to avoid oscillations, because turning on power DMOS M1 could remove the reverse bias condition.

Driver 838 is arranged to drive vertical power DMOS transistor M1 when the output of OR gate 837 is high, and not to drive vertical power DMOs transistor M1 when the output of OR gate 837 is low.

Protections block 839 may include over-voltage protection, over-current protection, over-temperature protection, and/or the like.

FIG. 8 illustrates one example of logic in conjunction with comparison output signal Comp; in other examples, other comparable logic may be used in place of the specific logic illustrated in FIG. 8.

As discussed above, in some examples, the well is switched with a separate well-switching DMOS rather than directly turning on power DMOS transistor M1 to limit the reverse bias. In other examples, power DMOS transistor M1 is turned on directly in order to limit the reverse bias of power DMOS transistor M1 rather than using a well-switching DMOS. In other examples, a well-switching DMOS is used and the power DMOS transistor M1 is turned on to limit the reverse bias. These examples and others are within the scope and spirit of the disclosure.

Example 1

A device, comprising: a monolithic integrated circuit, including: a low-voltage control circuit; a vertical power transistor including at least a drain; and a source follower including a drain that is coupled to the drain of the vertical power transistor, a gate that is coupled to a limit voltage node, and a source that is coupled to a high impedance node, wherein the source follower is arranged such that a source voltage at the source of the source follower is a voltage-limited version of a voltage at the drain of the vertical power transistor, wherein the low-voltage control circuit includes a driver and protection circuit that is arranged to detect the source voltage, to drive the vertical power transistor, and to adjust how the vertical power transistor is biased based, at least in part, on the source voltage.

Example 2

The device of example 1, wherein the source follower is a vertical transistor.

Example 3

The device of any combination of examples 1-2, wherein the low-voltage control circuit has a power supply input that is coupled to the limit voltage node.

Example 4

The device of any combination of examples 1-3, wherein the vertical power transistor is a first vertical double-diffused metal oxide semiconductor (DMOS) transistor, the source follower is a second vertical DMOS transistor, and wherein the first vertical DMOS transistor and the second vertical DMOS transistor share a common drain.

Example 5

The device of any combination of examples 1-4, wherein the monolithic integrated circuit further includes a high impedance device, and wherein the source follower and the high impedance device are arranged to operate together as a voltage divider.

Example 6

The device of example 5, wherein the high impedance device is at least one of: an active resistor, a passive resistor having a resistance of at least 50 KiloOhms, or a reverse-biased polysilicon diode.

Example 7

The device of any combination of examples 1-6, wherein the low-voltage control circuit further includes a comparator that is arranged to output a comparison output signal such that the comparison output signal has a first logic level if the source voltage exceeds a voltage threshold, and such that the comparison output signal has a second logic level otherwise.

Example 8

The device of example 7, wherein the driver and protection circuit is arranged to turn on the vertical power transistor when the comparison output signal corresponds to the second logic level.

Example 9

The device of any combination of examples 7-8, wherein the low-voltage control circuit is integrated into at least one well, the monolithic integrated circuit further includes a well switching transistor that is coupled between at least one well and the drain of the vertical power transistor, and wherein the well switching transistor is arranged to open and close based, at least in part, on the comparison output signal.

Example 10

The device of example 9, wherein the monolithic integrated circuit further includes a ground switching transistor that is coupled between the at least one well and a ground node, wherein the ground switching transistor is arranged to open and close based, at least in part, on the comparison output signal, such that the ground switching transistor is open when the well switching transistor is closed.

Example 11

The device of any combination of examples 9-10, wherein the vertical power transistor is a first vertical transistor, the source follower is a second vertical transistor, the well switching transistor is a third vertical transistor, and wherein the first, second, and third vertical transistors share a common drain.

Example 12

A method, comprising: using a high impedance device and a source follower including at least a drain that is coupled to a drain of a vertical power transistor and a source to output a source voltage at the source of the source follower such that the source voltage is a voltage-limited version of a voltage at the drain of a vertical power transistor; detecting the source voltage; driving the vertical power transistor; and adjusting how the vertical power transistor is biased based, at least in part, on the source voltage.

Example 13

The method of example 12, wherein the source follower is a vertical transistor.

Example 14

The method of any combination of examples 12-13, wherein: adjusting how the vertical power transistor is biased based, at least in part, on the source voltage includes: outputting a comparison output signal such that the comparison output signal has a first logic level if the source voltage exceeds a voltage threshold, and such that the comparison output signal has a second logic level otherwise; and adjusting how the vertical power transistor is biased based, at least in part, on the comparison output signal.

Example 15

The method of example 14, wherein adjusting how the vertical power transistor is biased based, at least in part, on the comparison output signal includes turning on the vertical power transistor when the comparison output signal corresponds to the second logic level.

Example 16

The method of any combination of examples 14-15, wherein adjusting how the vertical power transistor is biased based, at least in part, on the comparison output signal includes opening and closing a well switching transistor based, at least in part, on the comparison output signal, wherein the well switching transistor is coupled between at least one well and a ground node.

Example 17

The method of example 16, wherein adjusting how the vertical power transistor is biased based, at least in part, on the comparison output signal further includes opening and closing a ground switching transistor based, at least in part, on the comparison output signal, such that the ground switching transistor is open when the well switching transistor is closed, wherein the ground switching transistor is coupled between the at least one well and a ground node.

Example 18

A device, comprising: means for using a high impedance device and a source follower including at least a drain that is coupled to a drain of a vertical power transistor and a source to output a source voltage at the source of the source follower such that the source voltage is a voltage-limited version of a voltage at the drain of a vertical power transistor; means for detecting the source voltage; means for driving the vertical power transistor; and means for adjusting how the vertical power transistor is biased based, at least in part, on the source voltage.

Example 19

The device of example 18, wherein the means for adjusting how the vertical power transistor is biased based, at least in part, on the source voltage includes: means for outputting a comparison output signal such that the comparison output signal has a first logic level if the source voltage exceeds a voltage threshold, and such that the comparison output signal has a second logic level otherwise; and means for adjusting how the vertical power transistor is biased based, at least in part, on the comparison output signal.

Example 20

The device of example 19, wherein the means for adjusting how the vertical power transistor is biased based, at least in part, on the comparison output signal includes means for turning on the vertical power transistor when the comparison output signal corresponds to the second logic level.

These and other examples are within the scope of the following claims. The above specification, examples, and data provide a description of the manufacture and use of the composition of the disclosure. Since many examples of the disclosure can be made without departing from the scope and spirit of the disclosure, the disclosure also resides in the claims hereinafter appended.

What is claimed is:
1. A device, comprising:
a monolithic integrated circuit, including:
a low-voltage control circuit;
a vertical power transistor comprising a drain and a gate;
a source follower including a drain that is coupled to the drain of the vertical power transistor, a gate that is coupled to a limit voltage node, and a source that is coupled to a high impedance node, wherein the source follower is arranged such that a source voltage at the source of the source follower is a voltage-limited version of a voltage at the drain of the vertical power transistor,
wherein the low-voltage control circuit includes a driver and protection circuit that is arranged to detect the source voltage, to drive the vertical power transistor through the gate of the vertical power transistor, and to adjust how the vertical power transistor is biased based, at least in part, on the source voltage and
wherein the driver and protection circuit is arranged such that adjusting how the vertical power transistor is biased based, at least in part, on the source voltage includes: outputting a comparison output signal such that the comparison output signal has a first logic level if the source voltage exceeds a voltage threshold, and such that the comparison output signal has a second logic level otherwise; and adjusting how the vertical power transistor is biased based, at least in part, on the comparison output signal.

2. The device of claim 1, wherein the source follower is a vertical transistor.

3. The device of claim 1, wherein the low-voltage control circuit includes a power supply input that is coupled to the limit voltage node.

4. The device of claim 1, wherein the vertical power transistor is a first vertical double-diffused metal oxide semiconductor (DMOS) transistor, the source follower is a second vertical DMOS transistor, and wherein the first vertical DMOS transistor and the second vertical DMOS transistor share a common drain.

5. The device of claim 1, wherein the monolithic integrated circuit further includes a high impedance device, and wherein the source follower and the high impedance device are arranged to operate together as a voltage divider.

6. The device of claim 5, wherein the high impedance device is at least one of an active resistor, a passive resistor having a resistance of at least 50 KiloOhms, or a reverse-biased polysilicon diode.

7. The device of claim 1, wherein the driver and protection circuit is arranged to turn on the vertical power transistor when the comparison output signal corresponds to the second logic level.

8. The device of claim 1, wherein the low-voltage control circuit is integrated into at least one well, the monolithic integrated circuit further includes a well switching transistor that is coupled between the at least one well and the drain of the vertical power transistor, and wherein the well switching transistor is arranged to open and close based, at least in part, on the comparison output signal.

9. The device of claim 8, wherein the monolithic integrated circuit further includes a ground switching transistor that is coupled between the at least one well and a ground node, wherein the ground switching transistor is arranged to open and close based, at least in part, on the comparison output signal, such that the ground switching transistor is open when the well switching transistor is closed.

10. The device of claim 8, wherein the vertical power transistor is a first vertical transistor, the source follower is a second vertical transistor, the well switching transistor is a third vertical transistor, and wherein the first, second, and third vertical transistors share a common drain.

11. A method, comprising:
   using a high impedance device and a source follower comprising a drain that is coupled to a drain of a vertical power transistor and a source to output a source voltage at the source of the source follower such that the source voltage is a voltage-limited version of a voltage at the drain of a vertical power transistor;
   detecting the source voltage by a low-voltage control circuit includes a driver and protection circuit;
   driving the vertical power transistor through a gate of the vertical power transistor by the driver and protection circuit that is arranged to detect the source voltage;
   adjusting how the vertical power transistor is biased based, at least in part, on the source voltage and
   wherein adjusting how the vertical power transistor is biased based, at least in part, on the source voltage includes: outputting a comparison output signal such that the comparison output signal has a first logic level if the source voltage exceeds a voltage threshold, and such that the comparison output signal has a second logic level otherwise; and adjusting how the vertical power transistor is biased based, at least in part, on the comparison output signal.

12. The method of claim 11, wherein the source follower is a vertical transistor.

13. The method of claim 11, wherein adjusting how the vertical power transistor is biased based, at least in part, on the comparison output signal includes turning on the vertical power transistor when the comparison output signal corresponds to the second logic level.

14. The method of claim 11, wherein adjusting how the vertical power transistor is biased based, at least in part, on the comparison output signal includes opening and closing a well switching transistor based, at least in part, on the comparison output signal, wherein the well switching transistor is coupled between at least one well and a ground node.

15. The method of claim 14, wherein adjusting how the vertical power transistor is biased based, at least in part, on the comparison output signal further includes opening and closing a ground switching transistor based, at least in part, on the comparison output signal, such that the ground switching transistor is open when the well switching transistor is closed, wherein the ground switching transistor is coupled between at the least one well and a ground node.

* * * * *